(12) United States Patent
Qu et al.

(10) Patent No.: US 11,448,681 B2
(45) Date of Patent: Sep. 20, 2022

(54) INSULATION MONITORING CIRCUIT FOR MOTOR CONTROLLER

(71) Applicant: Jing-Jin Electric Technologies Co., Ltd., Beijing (CN)

(72) Inventors: Yuxia Qu, Beijing (CN); Fuxiang Wan, Beijing (CN); Lingling Tan, Beijing (CN)

(73) Assignee: Jing-Jin Electric Technologies Co., Ltd., Beijing (CN)

( * ) Notice: Subject to any disclaimer, the term of this patent is extended or adjusted under 35 U.S.C. 154(b) by 8 days.

(21) Appl. No.: 15/733,650

(22) PCT Filed: Mar. 13, 2019

(86) PCT No.: PCT/CN2019/077979
§ 371 (c)(1),
(2) Date: Sep. 24, 2020

(87) PCT Pub. No.: WO2019/192296
PCT Pub. Date: Oct. 10, 2019

(65) Prior Publication Data
US 2021/0011072 A1   Jan. 14, 2021

(30) Foreign Application Priority Data

Apr. 2, 2018   (CN) .......................... 201810284142.3

(51) Int. Cl.
*G01R 31/14* (2006.01)
*G01R 31/12* (2020.01)
(Continued)

(52) U.S. Cl.
CPC ......... *G01R 31/14* (2013.01); *G01R 31/1272* (2013.01); *B60K 1/00* (2013.01); *B60Q 9/00* (2013.01)

(58) Field of Classification Search
CPC .... G01R 31/14; G01R 31/1272; G01R 31/08; G01R 31/327; G01R 31/72; G01R 31/1263; G01R 31/52; B60K 1/00; B60Q 9/00
(Continued)

(56) References Cited

U.S. PATENT DOCUMENTS 8,283,929 B2 * 10/2012 Wang ...................... G01R 31/52
324/537
2011/0049977 A1 * 3/2011 Onnerud ............... B60L 3/0069
307/9.1
(Continued)

FOREIGN PATENT DOCUMENTS

CN       103278776 A       4/2009
CN       102269793 A   *  12/2011   .......... H02P 29/0241
(Continued)

OTHER PUBLICATIONS

English Translation of Zhang (CN 103308755 A). Publication Date—Sep. 2013; Translation date—2021. (Year: 2021).*
(Continued)

*Primary Examiner* — Patrick Assouad
*Assistant Examiner* — Sean Curtis
(74) *Attorney, Agent, or Firm* — LKGlobal | Lorenz & Kopf, LLP (57) ABSTRACT

An insulation monitoring electric circuit of an electric-motor controller, includes: a first voltage sampling circuit and a second voltage sampling circuit; the first voltage sampling circuit is connected to an input anode (+VBUS) of a busbar, an input cathode (PGND) of the busbar and a busbar-voltage sampled-signal (HV_VDC) line, and a busbar-voltage sampled-signal (HV_VDC) line is connected to the electric-motor controller; the second voltage sampling circuit is connected to the input anode (+VBUS) of the busbar, the
(Continued)

input cathode (PGND) of the busbar and an insulation-voltage sampled signal (HV_VDC) line, and an insulation-voltage sampled signal (HV_VISO) line is connected to the electric-motor controller; and the electric-motor controller is configured to compare a busbar-voltage value gathered by the first voltage sampling circuit and an insulation-voltage value gathered by the second voltage sampling circuit, and when the busbar-voltage value and the insulation-voltage value are different, emit an insulation monitoring alarming signal.

6 Claims, 2 Drawing Sheets

(51) Int. Cl.
  *B60K 1/00* (2006.01)
  *B60Q 9/00* (2006.01)
(58) Field of Classification Search
  USPC .......................................................... 324/551
  See application file for complete search history.

(56) References Cited

U.S. PATENT DOCUMENTS

| | | | | |
|---|---|---|---|---|
| 2011/0291662 | A1* | 12/2011 | Wang | H02P 29/0241 |
| | | | | 324/537 |
| 2017/0336476 | A1* | 11/2017 | Wand | G01R 31/007 |
| 2020/0350903 | A1* | 11/2020 | Gu | H03F 3/3086 |
| 2021/0011072 | A1* | 1/2021 | Qu | G01R 31/1272 |
| 2021/0057985 | A1* | 2/2021 | Yuxia | H02M 1/32 |
| 2021/0172987 | A1* | 6/2021 | Wang | G01R 27/18 |

FOREIGN PATENT DOCUMENTS

| | | | | | |
|---|---|---|---|---|---|
| CN | 102539917 | A | * | 7/2012 | |
| CN | 102967748 | A | | 3/2013 | |
| CN | 103308755 | A | * | 9/2013 | |
| CN | 103308755 | A | | 9/2013 | |
| CN | 103389436 | A | | 9/2013 | |
| CN | 103419643 | A | * | 12/2013 | |
| CN | 203616605 | U | | 5/2014 | |
| CN | 203894326 | U | | 10/2014 | |
| CN | 204044246 | U | | 12/2014 | |
| CN | 102269793 | B | * | 2/2015 | .......... H02P 29/0241 |
| CN | 104422825 | A | | 3/2015 | |
| CN | 104678175 | A | | 6/2015 | |
| CN | 103683428 | B | * | 8/2015 | |
| CN | 104898014 | A | | 9/2015 | |
| CN | 105337548 | A | | 2/2016 | |
| CN | 105785129 | A | * | 7/2016 | .......... G01R 27/025 |
| CN | 104702208 | B | | 1/2017 | |
| CN | 106405354 | A | | 2/2017 | |
| CN | 205941796 | U | | 2/2017 | |
| CN | 106468763 | A | * | 3/2017 | |
| CN | 206420997 | U | * | 8/2017 | |
| CN | 107121976 | A | * | 9/2017 | ......... G05B 23/0221 |
| CN | 108445870 | A | | 8/2018 | |
| CN | 108445870 | A | * | 8/2018 | ......... G01R 31/1227 |
| CN | 208077003 | U | | 11/2018 | |
| CN | 208077003 | U | * | 11/2018 | ......... G01R 31/1227 |
| CN | 109444686 | A | * | 3/2019 | |
| CN | 208580147 | U | * | 3/2019 | ............. G01R 19/00 |
| CN | 109669092 | A | * | 4/2019 | ............. B60L 3/0069 |
| CN | 208867977 | U | * | 5/2019 | |
| CN | 110927462 | A | * | 3/2020 | .......... G01R 27/025 |
| CN | 111660963 | A | * | 9/2020 | |
| CN | 112428830 | A | * | 3/2021 | |
| CN | 112582651 | B | * | 12/2021 | |
| DE | 102011102499 | A1 | * | 12/2011 | .......... H02P 29/0241 |
| DE | 102011012588 | A1 | * | 1/2012 | ............. G01R 31/02 |
| DE | 102016100868 | A1 | * | 7/2016 | ............. B60L 3/0069 |
| DE | 102016103883 | A1 | * | 9/2016 | .......... G01R 31/006 |
| DE | 102016106776 | A1 | | 10/2016 | |
| EP | 1265076 | A1 | | 12/2002 | |
| EP | 3734386 | A1 | * | 11/2020 | ......... G01R 31/1227 |
| JP | 2002122629 | A | | 4/2002 | |
| WO | WO-2011028703 | A2 | * | 3/2011 | .......... B60L 11/1864 |
| WO | WO-2019192296 | A1 | * | 10/2019 | ......... G01R 31/1227 |

OTHER PUBLICATIONS

English Translation of Wei et al. (CN 107121976 A). Publication Date—Sep. 2017; Translation date—2021. (Year: 2021).*

The State Intellectual Property Office of the People's Republic China, The Second Office Action, Application No. 201810284142A, dated Apr. 16, 2020.

* cited by examiner

INSULATION MONITORING CIRCUIT FOR MOTOR CONTROLLER

CROSS-REFERENCE TO RELATED APPLICATION

This application is a U.S. National-Stage entry under 35 U.S.C. § 371 based on International Application No. PCT/CN2019/077979, filed Mar. 13, 2019 which was published under PCT Article 21(2) and which claims priority to Chinese Application No. 201810284142.3, filed Apr. 2, 2018, which are all hereby incorporated herein in their entirety by reference.

TECHNICAL FIELD

This Application pertains to the technical field of electric-motor controllers of electric vehicles, and particularly relates to an insulation monitoring electric circuit of an electric-motor controller.

BACKGROUND

In the fields such as vehicle power, electric-motor controllers, as the core component for the power of the entire car, are of vital importance for the control safety of the entire car. Insulation malfunctions can seriously affect the safety of the electric-motor controller and the entire car, so it is required to monitor insulation malfunctions. However, currently, most of insulation monitoring electric circuits of electric-motor controllers are complicated, and have a high cost, which cannot satisfy the practical demands. In addition, other objects, desirable features and characteristics will become apparent from the subsequent summary and detailed description, and the appended claims, taken in conjunction with the accompanying drawings and this background.

SUMMARY

The present disclosure provides an insulation monitoring electric circuit of an electric-motor controller, to solve the problems of the current electric-motor controllers of a complicated electric circuit and a high cost.

According to one aspect of the present disclosure, there is provided an insulation monitoring electric circuit of an electric-motor controller, wherein the insulation monitoring electric circuit comprises: a first voltage sampling circuit and a second voltage sampling circuit;

the first voltage sampling circuit is connected to an input anode of a busbar, an input cathode of the busbar and a busbar-voltage sampled signal line, and a busbar-voltage sampled signal line is connected to the electric-motor controller;

the second voltage sampling circuit is connected to the input anode of the busbar, the input cathode of the busbar and an insulation-voltage sampled signal line, and an insulation-voltage sampled signal line is connected to the electric-motor controller; and the electric-motor controller is configured to compare a busbar-voltage value gathered by the first voltage sampling circuit and an insulation-voltage value gathered by the second voltage sampling circuit, and when the busbar-voltage value and the insulation-voltage value are different, emit an insulation monitoring alarming signal.

Optionally, the first voltage sampling circuit comprises: a first optical coupler, a first operational amplifier, and a second sampling resistor, a third sampling resistor, a fourth sampling resistor, a fifth sampling resistor, a sixth sampling resistor, a seventh sampling resistor and an eighth sampling resistor that are sequentially connected in series;

one end of the second sampling resistor is connected to the input anode of the busbar;

one end of the eighth sampling resistor is firstly connected in series to an eleventh sampling resistor and then to the input cathode of the busbar;

the other end of the eighth sampling resistor is connected to a signal input end of the first optical coupler;

a signal output cathode of the first optical coupler is connected to an inverted input end of the first operational amplifier;

a signal output anode of the first optical coupler is connected to a non-inverted input end of the first operational amplifier; and an output end of the first operational amplifier is connected to the busbar-voltage sampled signal line.

Optionally, the first voltage sampling circuit further comprises: a filter capacitor and an amplification regulating resistor;

the filter capacitor comprises a first filter capacitor, a second filter capacitor, a third filter capacitor, a fourth filter capacitor, a fifth filter capacitor and a sixth filter capacitor;

the amplification regulating resistor comprises: a first amplification regulating resistor, a ninth amplification regulating resistor, a tenth amplification regulating resistor and a twelfth amplification regulating resistor;

one end of the first filter capacitor is connected to the busbar-voltage sampled signal line and connected to one end of the first amplification regulating resistor;

the other end of the first filter capacitor is firstly connected to the other end of the first amplification regulating resistor and then connected to one end of the ninth amplification regulating resistor, and the one end of the ninth amplification regulating resistor is also connected to the inverted input end of the first operational amplifier;

the other end of the ninth amplification regulating resistor is connected to the signal output cathode of the first optical coupler;

one end of the second filter capacitor is connected to a power supplying end of an output power supply of the first optical coupler;

the other end of the second filter capacitor is grounded;

one end of the third filter capacitor is connected to a power supplying end of an input power supply of the first optical coupler;

the other end of the third filter capacitor is firstly connected to the other end of the fourth filter capacitor and then grounded;

one end of the fourth filter capacitor is connected to a signal input end of the first optical coupler;

one end of the fifth filter capacitor is connected to one end of the tenth amplification regulating resistor and the non-inverted input end of the first operational amplifier;

the other end of the fifth filter capacitor is firstly connected to one end of the twelfth amplification regulating resistor and then grounded;

the other end of the tenth amplification regulating resistor is connected to the signal output anode of the first optical coupler;

the other end of the twelfth amplification regulating resistor is connected to the non-inverted input end of the first operational amplifier; and one end of the sixth filter capacitor is connected to a power supplying end of a power supply of the first operational amplifier, and the other end of the sixth filter capacitor is grounded.

Optionally, the second voltage sampling circuit comprises: a second optical coupler, a second operational amplifier, and a fourteenth sampling resistor, a fifteenth sampling resistor, a sixteenth sampling resistor, a seventeenth sampling resistor, an eighteenth sampling resistor, a nineteenth sampling resistor, a twentieth sampling resistor, a twenty-first sampling resistor, a twenty-second sampling resistor, a twenty-third sampling resistor, a twenty-fourth sampling resistor, a twenty-fifth sampling resistor, a twenty-sixth sampling resistor and a twenty-seventh sampling resistor that are sequentially connected in series;

one end of the fourteenth sampling resistor is connected to the input anode of the busbar;

one end of the twentieth sampling resistor and one end of the twenty-first sampling resistor are firstly connected and then grounded;

one end of the twenty-seventh sampling resistor is firstly connected in series to a thirtieth sampling resistor and then to the input cathode of the busbar;

the other end of the twenty-seventh sampling resistor is connected to a signal input end of the second optical coupler;

a signal output cathode of the second optical coupler is connected to an inverted input end of the second operational amplifier;

a signal output anode of the second optical coupler is connected to a non-inverted input end of the second operational amplifier; and an output end of the second operational amplifier is connected to the insulation-voltage sampled signal line.

Optionally, the second voltage sampling circuit further comprises: a seventh filter capacitor, an eighth filter capacitor, a ninth filter capacitor, a tenth filter capacitor, an eleventh filter capacitor, a thirteenth amplification regulating resistor, a twenty-eighth amplification regulating resistor, a twenty-ninth amplification regulating resistor and a thirty-first amplification regulating resistor;

one end of the seventh filter capacitor is connected to one end of the thirteenth amplification regulating resistor and connected to the insulation-voltage sampled signal line;

the other end of the seventh filter capacitor is firstly connected to the other end of the thirteenth amplification regulating resistor and then connected to one end of the twenty-eighth amplification regulating resistor, and the one end of the twenty-eighth amplification regulating resistor is also connected to the inverted input end of the second operational amplifier;

the other end of the twenty-eighth amplification regulating resistor is connected to the signal output cathode of the second optical coupler;

one end of the eighth filter capacitor is connected to a power supplying end of an output power supply of the second optical coupler;

the other end of the eighth filter capacitor is grounded;

one end of the ninth filter capacitor is connected to a power supplying end of an input power supply of the second optical coupler;

the other end of the ninth filter capacitor is firstly connected to the other end of the tenth filter capacitor and then grounded;

one end of the tenth filter capacitor is connected to the other end of the twenty-seventh sampling resistor and the signal input end of the second optical coupler;

one end of the eleventh filter capacitor is connected to one end of the twenty-ninth amplification regulating resistor and the non-inverted input end of the second operational amplifier;

the other end of the eleventh filter capacitor is firstly connected to one end of the thirty-first amplification regulating resistor and then grounded;

the other end of the twenty-ninth amplification regulating resistor is connected to the signal output anode of the second optical coupler; and the other end of the thirty-first amplification regulating resistor is connected to the non-inverted input end of the second operational amplifier.

Optionally, the insulation monitoring electric circuit further comprises a voltage converter;

the voltage converter comprises: a power-supply converting chip, a twelfth filter capacitor, a thirteenth filter capacitor, a fourteenth filter capacitor and a fifteenth filter capacitor;

an input end of the power-supply converting chip is connected to a power supply, one end of the twelfth filter capacitor and one end of the thirteenth filter capacitor;

the other end of the twelfth filter capacitor and the other end of the thirteenth filter capacitor are firstly connected and then grounded;

an output end of the power-supply converting chip is connected to the power supplying end of the input power supply of the first optical coupler;

the output end of the power-supply converting chip is also connected to one end of the fourteenth filter capacitor and one end of the fifteenth filter capacitor; and the other end of the fourteenth filter capacitor and the other end of the fifteenth filter capacitor are firstly connected and then grounded.

Optionally, the insulation monitoring electric circuit further comprises a voltage converter;

the voltage converter comprises: a power-supply converting chip, a twelfth filter capacitor, a thirteenth filter capacitor, a fourteenth filter capacitor and a fifteenth filter capacitor;

an input end of the power-supply converting chip is connected to a power supply, one end of the twelfth filter capacitor and one end of the thirteenth filter capacitor;

the other end of the twelfth filter capacitor and the other end of the thirteenth filter capacitor are firstly connected and then grounded;

an output end of the power-supply converting chip is connected to the power supplying of the input-end power supply of the second optical coupler;

the output end of the power-supply converting chip is also connected to one end of the fourteenth filter capacitor and one end of the fifteenth filter capacitor; and the other end of the fourteenth filter capacitor and the other end of the fifteenth filter capacitor are firstly connected and then grounded.

The advantageous effects of the present disclosure are as follows. In the insulation monitoring electric circuit of an electric-motor controller of the embodiments of the present disclosure, the two voltage sampling circuits are employed to individually gather the busbar voltage and the insulation voltage and compare the values of them, and if the values are different, the insulation monitoring alarming signal is emitted, which guarantees the safety of the electric-motor controller and the safety of the entire car. The insulation monitoring electric circuit of the present embodiments has a simple structure, a good applicability and a low cost, which satisfies the practical demands.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

The design concept of the present disclosure is as follows. Aiming at the problems of the current electric-motor controllers of a complicated electric circuit and a high cost, the embodiments of the present disclosure provide an insulation monitoring electric circuit of an electric-motor controller. When a poor impedance insulation between the busbar anode or cathode of the electric-motor controller and the ground happens, the controller, by using the insulation monitoring electric circuit, makes detection and determination, and emits an alarm, and can inform the controller of the entire car about the insulation malfunction, which can guarantee that the controller of the entire car can timely upload the malfunction to the dashboard, to enable the driver to timely see it, to guarantee the safety of the passenger.

The insulation monitoring electric circuit of an electric-motor controller of the present embodiment comprises: a first voltage sampling circuit and a second voltage sampling circuit; the first voltage sampling circuit is connected to an input anode of a busbar, an input cathode of the busbar and a busbar-voltage sampled signal line, and a busbar-voltage sampled signal is connected to the electric-motor controller; the second voltage sampling circuit is connected to the input anode of the busbar, the input cathode of the busbar and an insulation-voltage sampled signal line, and an insulation-voltage sampled signal line is connected to the electric-motor controller; and the electric-motor controller is configured to compare a busbar-voltage value gathered by the first voltage sampling circuit and an insulation-voltage value gathered by the second voltage sampling circuit, and when the busbar-voltage value and the insulation-voltage value are different, emit an insulation monitoring alarming signal. The electric circuit has a simple and practical structure and a low cost, which satisfies the practical demands. Generally, the electric-motor controller comprises a battery for electric vehicle, and further comprises a busbar connected to the battery for electric vehicle. The function of the busbar is to accumulate, distribute and transmit electric energy. The busbar voltage refers to the voltage on the rectangular or circular busbar. The positive busbar and negative busbar are the buses for supplying electricity, and the negative busbar and the positive busbar form the loop, to supply to the power supply of the load.

Figure 1:
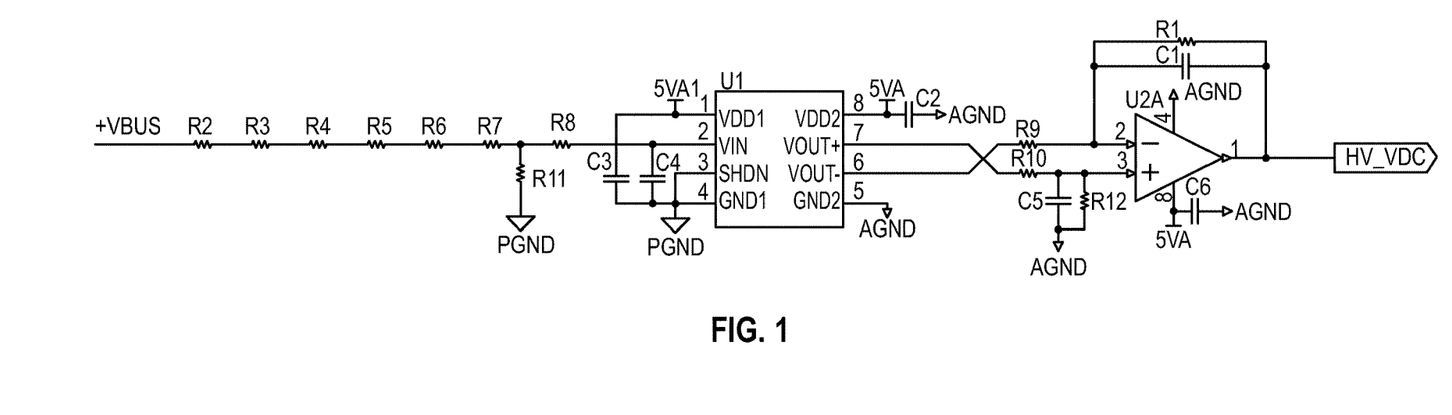
FIG. 1 is a first schematic diagram of the insulation monitoring electric circuit of an electric-motor controller according to an embodiment of the present disclosure.
Figure 2:
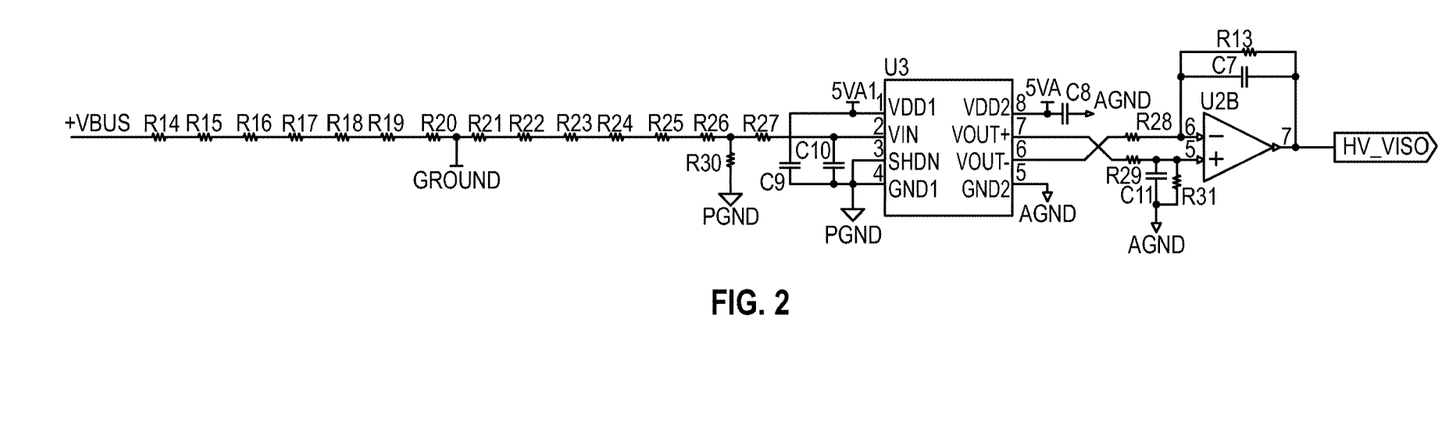
FIG. 2 is a second schematic diagram of the insulation monitoring electric circuit of an electric-motor controller according to an embodiment of the present disclosure.
Figure 3:
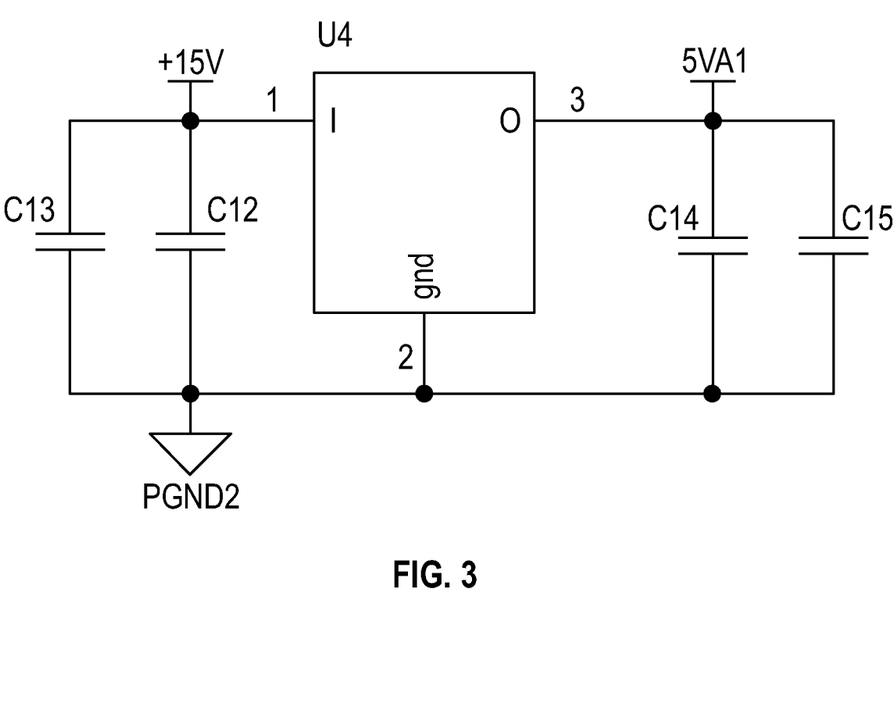
FIG. 3 is a third schematic diagram of the insulation monitoring electric circuit of an electric-motor controller according to an embodiment of the present disclosure.

FIG. 1 is a schematic diagram of the insulation monitoring electric circuit of an electric-motor controller according to an embodiment of the present disclosure. The insulation monitoring electric circuit of an electric-motor controller of the present embodiment will be described below by referring to FIG. 1.

The insulation monitoring electric circuit of an electric-motor controller of the present embodiment comprises a first voltage sampling circuit, a second voltage sampling circuit and a voltage converter.

Referring to FIG. 1, the first voltage sampling circuit comprises: a first optical coupler U3, a first operational amplifier, and a second sampling resistor R2, a third sampling resistor R3, a fourth sampling resistor R4, a fifth sampling resistor R5, a sixth sampling resistor R6, a seventh sampling resistor R7 and an eighth sampling resistor R8 that are sequentially connected in series;

one end of the second sampling resistor R2 is connected to an input anode +VBUS of the busbar;

one end of the eighth sampling resistor R8 is firstly connected in series to an eleventh sampling resistor R11 and then to an input cathode of the busbar; and a PGND is connected to the input cathode of the high-voltage busbar.

The other end of the eighth sampling resistor R8 is connected to a signal input end Vin of the first optical coupler U1;

a signal output cathode VOUT− of the first optical coupler U1 is connected to an inverted input end (i.e., the pin 2) of the first operational amplifier (i.e., the operational amplifier 1);

a signal output anode VOUT+ of the first optical coupler U1 is connected to a non-inverted input end (i.e., the pin 3) of the first operational amplifier; and an output end (i.e., the pin 1) of the first operational amplifier is connected to a busbar-voltage sampled signal HV_VDC line. The voltage sampled signal HV_VDC of the busbar is connected to an electric-motor controller MCU (not shown in FIG. 1).

In FIG. 1, the SHDN of the first optical coupler U1 refers to an external high-shutdown lead, and the GND1 refers to a grounding lead of an input-end power supply.

Referring to FIG. 1, the first voltage sampling circuit further comprises: a filter capacitor and an amplification regulating resistor;

the filter capacitor comprises a first filter capacitor C1, a second filter capacitor C2, a third filter capacitor C3, a fourth filter capacitor C4, a fifth filter capacitor C5 and a sixth filter capacitor C6;

the amplification regulating resistor comprises: a first amplification regulating resistor R1, a ninth amplification regulating resistor R9, a tenth amplification regulating resistor R10 and a twelfth amplification regulating resistor R12; and one end of a first filter capacitor C1 is connected to the busbar-voltage sampled signal HV_VDC line and one end of a first amplification regulating resistor R1.

The other end of the first filter capacitor C1 is firstly connected to the other end of the first amplification regulating resistor R1 and then connected to one end of the ninth amplification regulating resistor R9, and the one end of the ninth amplification regulating resistor R9 is also connected to the inverted input end (i.e., the pin 2) of the first operational amplifier;

the other end of the ninth amplification regulating resistor R9 is connected to the signal output cathode VOUT− of the first optical coupler U1;

one end of the second filter capacitor C2 is connected to a power supplying end VDD2 of an output power supply of the first optical coupler U1;

the other end of the second filter capacitor C2 is grounded (i.e., to an analog ground AGND);

one end of the third filter capacitor C3 is connected to a power supplying end VDD1 of an input power supply of the first optical coupler U1;

the other end of the third filter capacitor C3 and the other end of the fourth filter capacitor C4 are firstly connected and then grounded (i.e., to the PGND);

one end of the fourth filter capacitor C4 is connected to the signal input end Vin of the first optical coupler U1;

one end of the fifth filter capacitor C5 is connected to one end of the tenth amplification regulating resistor R10 and the non-inverted input end (the pin 3) of the first operational amplifier;

the other end of the fifth filter capacitor C5 is firstly connected to one end of the twelfth amplification regulating resistor R12 and then grounded;

the other end of the tenth amplification regulating resistor R10 is connected to the signal output anode VOUT+ of the first optical coupler U1;

the other end of the twelfth amplification regulating resistor R12 is connected to the non-inverted input end of the first operational amplifier; and one end of the sixth filter capacitor C6 is connected to a power supplying end (5VA) of a power supply of the first operational amplifier, the other end of the sixth filter capacitor C6 is grounded (i.e., to the analog ground AGND).

It should be noted that the first voltage sampling circuit comprises a plurality of sampling resistors. That is because the insulation impedance between the anode or cathode of the busbar and the housing is required to satisfy the requirement of being above megohm, so, in order to match the insulation impedance between the anode or cathode of the busbar and the housing, a large number of resistors are required to be connected in series, and the housing is to be connected among the resistors.

Referring to FIG. 1, the second voltage sampling circuit comprises: a second optical coupler U3, a second operational amplifier, and a fourteenth sampling resistor R14, a fifteenth sampling resistor R15, a sixteenth sampling resistor R16, a seventeenth sampling resistor R17, an eighteenth sampling resistor R18, a nineteenth sampling resistor R19, a twentieth sampling resistor R20, a twenty-first sampling resistor R21, a twenty-second sampling resistor R22, a twenty-third sampling resistor R23, a twenty-fourth sampling resistor R24, a twenty-fifth sampling resistor R25, a twenty-sixth sampling resistor R26 and a twenty-seventh sampling resistor R27 that are sequentially connected in series;

one end of the fourteenth sampling resistor R14 is connected to the input anode +VBUS of the busbar; and one end of the twentieth sampling resistor R20 and one end of the twenty-first sampling resistor R21 are firstly connected and then grounded GROUND, that is, the middle point of the circuit is connected to the ground.

One end of the twenty-seventh sampling resistor R27 is firstly connected in series to a thirtieth sampling resistor R30 and then to the input cathode PGND of the busbar. Referring to FIG. 1, one end of the thirtieth sampling resistor R30 is connected to one end of the twenty-seventh sampling resistor R27 and one end of the twenty-sixth sampling resistor R26, and the other end of the thirtieth sampling resistor R30 is connected to the input cathode PGND of the busbar.

The other end of the twenty-seventh sampling resistor R27 is connected to a signal input end Vin of the second optical coupler U3;

a signal output cathode VOUT− of the second optical coupler U3 is connected to an inverted input end (the pin 6) of the second operational amplifier;

a signal output anode VOUT+ of the second optical coupler U3 is connected to a non-inverted input end (the pin 5) of the second operational amplifier; and an output end (the pin 7) of the second operational amplifier is connected to an insulation-voltage sampled signal HV_VISO line. The HV_VISO line is connected to the electric-motor controller MCU.

In order to guarantee the accuracy of the insulation monitoring electric circuit, the resistance values of the sampling resistors of the second voltage sampling circuit of the present embodiment are far greater than the designed threshold of the ground insulation impedance. That is because when the resistors of the circuit employ small resistance values, if the insulation impedance between the positive or negative busbar and the housing is changed, the sampled voltage cannot be easily expressed. The thresholds of the ground insulation impedances can be seen in the national standards of China.

Referring to FIG. 1, the second voltage sampling circuit further comprises: a seventh filter capacitor C7, an eighth filter capacitor C8, a ninth filter capacitor C9, a tenth filter capacitor C10, an eleventh filter capacitor C11, a thirteenth amplification regulating resistor R13, a twenty-eighth amplification regulating resistor R28, a twenty-ninth amplification regulating resistor R29 and a thirty-first amplification regulating resistor R31;

one end of the seventh filter capacitor C7 is connected to one end of the thirteenth amplification regulating resistor R13 and connected to the insulation-voltage sampled signal HV_VISO line;

the other end of the seventh filter capacitor C7 is firstly connected to the other end of the thirteenth amplification regulating resistor R13 and then connected to one end of the twenty-eighth amplification regulating resistor R28, and the one end of the twenty-eighth amplification regulating resistor R28 is also connected to the inverted input end (the pin 6) of the second operational amplifier;

the other end of the twenty-eighth amplification regulating resistor R28 is connected to the signal output cathode VOUT− of the second optical coupler U3;

one end of the eighth filter capacitor C8 is connected to a power supplying end VDD2 of an output power supply of the second optical coupler U3;

the other end of the eighth filter capacitor C8 is grounded;

one end of the ninth filter capacitor C9 is connected to a power supplying end VDD1 of an input power supply of the second optical coupler U3;

the other end of the ninth filter capacitor C9 is firstly connected to the other end of the tenth filter capacitor C10 and then grounded;

one end of the tenth filter capacitor C10 is connected to the other end of the twenty-seventh sampling resistor R27 and the signal input end Vin of the second optical coupler U3;

one end of the eleventh filter capacitor C11 is connected to one end of the twenty-ninth amplification regulating resistor R29 and the non-inverted input end (the pin 5) of the second operational amplifier;

the other end of the eleventh filter capacitor C11 is firstly connected to one end of the thirty-first amplification regulating resistor R31 and then grounded;

the other end of the twenty-ninth amplification regulating resistor R29 is connected to the signal output anode VOUT+ of the second optical coupler U3; and the other end of the thirty-first amplification regulating resistor R31 is connected to the non-inverted input end of the second operational amplifier.

Referring to FIG. 1, the insulation monitoring electric circuit of an electric-motor controller of the present embodiment further comprises a voltage converter;

the voltage converter comprises: a power-supply converting chip U4, a twelfth filter capacitor C12, a thirteenth filter capacitor C13, a fourteenth filter capacitor C14 and a fifteenth filter capacitor C15;

an input end (the pin 1) of the power-supply converting chip is connected to a power supply, one end of the twelfth filter capacitor C12 and one end of the thirteenth filter capacitor C13;

the other end of the twelfth filter capacitor C12 and the other end of the thirteenth filter capacitor C13 are firstly connected and then grounded;

an output end (the pin 1) of the power-supply converting chip U4 is connected to the power supplying end VDD1 of the input-end power supply of the first optical coupler U1;

the output end (the pin 1) of the power-supply converting chip is also connected to one end of the fourteenth filter capacitor and one end of the fifteenth filter capacitor; and the other end of the fourteenth filter capacitor C14 and the other end of the fifteenth filter capacitor C15 are firstly connected and then grounded.

Furthermore, the output end of the power-supply converting chip U4 is connected to the power supplying end VDD1 of the input-end power supply of the second optical coupler U3.

In the electric circuit shown in FIG. 1, in the first voltage sampling circuit, the voltage inputted into the optical coupler U1 is:

$Vin1=Vbus/[(R2+R3+R4+R5+R6+R7+R11)*R11]$, wherein the * represents multiplying.

After being amplified by K1 times by the first operational amplifier, the voltage outputted to the AD sampling port of the electric-motor controller MCU is $Vad1=Vin*K1$.

In the second voltage sampling circuit, the voltage inputted into the optical coupler U3 is:

$$Vin2 = \frac{Vbus}{[(R14+\ldots R26 + R30)*R30]}$$

wherein R14+ . . . R26 represents:
R14+R15+R16+R17+R18+R19+R20+R21+R22+R23+R24+R25+R26.

After being amplified by K2 times by the second operational amplifier, the voltage outputted to the AD sampling port of the electric-motor controller MCU is $Vad2=Vin2*K2$ Therefore, when a small impedance Rx is connected in parallel to a high-voltage positive busbar or a high-voltage negative busbar, the voltage sampled value of the second voltage sampling circuit is calculated as follows:

The input voltage of the optical coupler U3

$$Vin3 = \frac{Vbus}{\left[\frac{(R14+\ldots R20)*Rx}{(R14+\ldots R20+Rx)+R21+\ldots R26+R30}\right]*R30}$$

wherein R14+ . . . R20 represents: R14+R15+R16+R17+R18+R19+R20, and R21+ . . . R26 represents: R21+R22+R23+R24+R25+R26.

In turn, after being amplified by K2 times by the operational amplifier, the voltage outputted to the AD sampling port of the electric-motor controller MCU is $Vad3=Vin3*K2$.

At this point, the busbar voltage Vbus3 derived from the gathered voltage value Vad3 must be greater than the derived Vbus1 of the first voltage sampling circuit, so it can be determined that the electric-motor controller has an insulation malfunction.

The first voltage sampling circuit of the present embodiment is the voltage sampling circuit of the high-voltage busbar, and performs the sampling by connecting in series a resistor on the busbar voltage to divide the voltage. When the positive or negative busbar is short-circuited to the ground, the resistors in the electric circuit are short-circuited, so the voltage at the sampling end will change. Moreover, when it is compared with the first channel of the busbar voltage, it can be determined that the insulation between the positive or negative busbar and the ground does not satisfy the requirements, so an insulation malfunction has happened.

In conclusion, the insulation monitoring electric circuit of an electric-motor controller of the present embodiment has a simple structure, a good applicability and a low cost, and can be conveniently promoted and applied on a large scale. Furthermore, it can monitor insulation malfunctions of the electric-motor controller, to guarantee the safety of the electric-motor controller and the entire car.

The above are merely particular embodiments of the present disclosure. By the teaching of the present disclosure, a person skilled in the art can make other modifications or variations on the basis of the above embodiments. A person skilled in the art should understand that the above particular descriptions are only for the purpose of better interpreting the present disclosure, and the protection scope of the present disclosure should be subject to the protection scope of the claims.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

What is claimed is:

1. An insulation monitoring electric circuit of an electric-motor controller, wherein the insulation monitoring electric circuit comprises: a first voltage sampling circuit and a second voltage sampling circuit;

the first voltage sampling circuit is connected to an input anode of a busbar, an input cathode of the busbar and a busbar-voltage sampled signal line, and the busbar-voltage sampled signal line is connected to the electric-motor controller;

the second voltage sampling circuit is connected to the input anode of the busbar, the input cathode of the busbar and an insulation-voltage sampled signal line, and the insulation-voltage sampled signal line is connected to the electric-motor controller; and the electric-motor controller is configured to compare a busbar-voltage value gathered by the first voltage sampling circuit and an insulation-voltage value gathered by the second voltage sampling circuit, and when the busbar-voltage value and the insulation-voltage value are different, emit an insulation monitoring alarming signal, wherein the first voltage sampling circuit comprises: a first optical coupler, a first operational amplifier, and a second sampling resistor, a third sampling resistor, a fourth sampling resistor, a fifth sampling resistor, a sixth sampling resistor, a seventh sampling resistor and an eighth sampling resistor that are sequentially connected in series;

one end of the second sampling resistor is connected to the input anode of the busbar;

one end of the eighth sampling resistor is firstly connected in series to an eleventh sampling resistor and then to the input cathode of the busbar;

the other end of the eighth sampling resistor is connected to a signal input end of the first optical coupler;

a signal output cathode of the first optical coupler is connected to an inverted input end of the first operational amplifier;

a signal output anode of the first optical coupler is connected to a non-inverted input end of the first operational amplifier; and an output end of the first operational amplifier is connected to the busbar-voltage sampled signal line.

2. The insulation monitoring electric circuit of an electric-motor controller according to claim 1, wherein the first voltage sampling circuit further comprises: a filter capacitor and an amplification regulating resistor;

the filter capacitor comprises a first filter capacitor, a second filter capacitor, a third filter capacitor, a fourth filter capacitor, a fifth filter capacitor and a sixth filter capacitor;

the amplification regulating resistor comprises: a first amplification regulating resistor, a ninth amplification regulating resistor, a tenth amplification regulating resistor and a twelfth amplification regulating resistor;

one end of the first filter capacitor is connected to the busbar-voltage sampled signal line and connected to one end of the first amplification regulating resistor;

the other end of the first filter capacitor is firstly connected to the other end of the first amplification regulating resistor and then connected to one end of the ninth amplification regulating resistor, and the one end of the ninth amplification regulating resistor is also connected to the inverted input end of the first operational amplifier;

the other end of the ninth amplification regulating resistor is connected to the signal output cathode of the first optical coupler;

one end of the second filter capacitor is connected to a power supplying end of an output power supply of the first optical coupler;

the other end of the second filter capacitor is grounded;

one end of the third filter capacitor is connected to a power supplying end of an input power supply of the first optical coupler;

the other end of the third filter capacitor is firstly connected to the other end of the fourth filter capacitor and then grounded;

one end of the fourth filter capacitor is connected to a signal input end of the first optical coupler;

one end of the fifth filter capacitor is connected to one end of the tenth amplification regulating resistor and the non-inverted input end of the first operational amplifier;

the other end of the fifth filter capacitor is firstly connected to one end of the twelfth amplification regulating resistor and then grounded;

the other end of the tenth amplification regulating resistor is connected to the signal output anode of the first optical coupler;

the other end of the twelfth amplification regulating resistor is connected to the non-inverted input end of the first operational amplifier; and one end of the sixth filter capacitor is connected to a power supplying end of a power supply of the first operational amplifier, and the other end of the sixth filter capacitor is grounded.

3. An insulation monitoring electric circuit of an electric-motor controller, wherein the insulation monitoring electric circuit comprises: a first voltage sampling circuit and a second voltage sampling circuit;

the first voltage sampling circuit is connected to an input anode of a busbar, an input cathode of the busbar and a busbar-voltage sampled signal line, and the busbar-voltage sampled signal line is connected to the electric-motor controller;

the second voltage sampling circuit is connected to the input anode of the busbar, the input cathode of the busbar and an insulation-voltage sampled signal line, and the insulation-voltage sampled signal line is connected to the electric-motor controller; and the electric-motor controller is configured to compare a busbar-voltage value gathered by the first voltage sampling circuit and an insulation-voltage value gathered by the second voltage sampling circuit, and when the busbar-voltage value and the insulation-voltage value are different, emit an insulation monitoring alarming signal, wherein the second voltage sampling circuit comprises: a second optical coupler, a second operational amplifier, and a fourteenth sampling resistor, a fifteenth sampling resistor, a sixteenth sampling resistor, a seventeenth sampling resistor, an eighteenth sampling resistor, a nineteenth sampling resistor, a twentieth sampling resistor, a twenty-first sampling resistor, a twenty-second sampling resistor, a twenty-third sampling resistor, a twenty-fourth sampling resistor, a twenty-fifth sampling resistor, a twenty-sixth sampling resistor and a twenty-seventh sampling resistor that are sequentially connected in series;

one end of the fourteenth sampling resistor is connected to the input anode of the busbar;

one end of the twentieth sampling resistor and one end of the twenty-first sampling resistor are firstly connected and then grounded;

one end of the twenty-seventh sampling resistor is firstly connected in series to a thirtieth sampling resistor and then to the input cathode of the busbar;

the other end of the twenty-seventh sampling resistor is connected to a signal input end of the second optical coupler;

a signal output cathode of the second optical coupler is connected to an inverted input end of the second operational amplifier;

a signal output anode of the second optical coupler is connected to a non-inverted input end of the second operational amplifier; and an output end of the second operational amplifier is connected to the insulation-voltage sampled signal line.

4. The insulation monitoring electric circuit of an electric-motor controller according to claim 3, wherein the second voltage sampling circuit further comprises: a seventh filter capacitor, an eighth filter capacitor, a ninth filter capacitor, a tenth filter capacitor, an eleventh filter capacitor, a thirteenth amplification regulating resistor, a twenty-eighth amplification regulating resistor, a twenty-ninth amplification regulating resistor and a thirty-first amplification regulating resistor;

one end of the seventh filter capacitor is connected to one end of the thirteenth amplification regulating resistor and connected to the insulation-voltage sampled signal line;

the other end of the seventh filter capacitor is firstly connected to the other end of the thirteenth amplification regulating resistor and then connected to one end of the twenty-eighth amplification regulating resistor, and the one end of the twenty-eighth amplification regulating resistor is also connected to the inverted input end of the second operational amplifier;

the other end of the twenty-eighth amplification regulating resistor is connected to the signal output cathode of the second optical coupler;

one end of the eighth filter capacitor is connected to a power supplying end of an output power supply of the second optical coupler;

the other end of the eighth filter capacitor is grounded;

one end of the ninth filter capacitor is connected to a power supplying end of an input power supply of the second optical coupler;

the other end of the ninth filter capacitor is firstly connected to the other end of the tenth filter capacitor and then grounded;

one end of the tenth filter capacitor is connected to the other end of the twenty-seventh sampling resistor and the signal input end of the second optical coupler;

one end of the eleventh filter capacitor is connected to one end of the twenty-ninth amplification regulating resistor and the non-inverted input end of the second operational amplifier;

the other end of the eleventh filter capacitor is firstly connected to one end of the thirty-first amplification regulating resistor and then grounded;

the other end of the twenty-ninth amplification regulating resistor is connected to the signal output anode of the second optical coupler; and the other end of the thirty-first amplification regulating resistor is connected to the non-inverted input end of the second operational amplifier.

5. The insulation monitoring electric circuit of an electric-motor controller according to claim 1, wherein the insulation monitoring electric circuit further comprises a voltage converter;

the voltage converter comprises: a power-supply converting chip, a twelfth filter capacitor, a thirteenth filter capacitor, a fourteenth filter capacitor and a fifteenth filter capacitor;

an input end of the power-supply converting chip is connected to a power supply, one end of the twelfth filter capacitor and one end of the thirteenth filter capacitor;

the other end of the twelfth filter capacitor and the other end of the thirteenth filter capacitor are firstly connected and then grounded;

an output end of the power-supply converting chip is connected to the power supplying end of the input power supply of the first optical coupler;

the output end of the power-supply converting chip is also connected to one end of the fourteenth filter capacitor and one end of the fifteenth filter capacitor; and the other end of the fourteenth filter capacitor and the other end of the fifteenth filter capacitor are firstly connected and then grounded.

6. The insulation monitoring electric circuit of an electric-motor controller according to claim 3, wherein the insulation monitoring electric circuit further comprises a voltage converter;

the voltage converter comprises: a power-supply converting chip, a twelfth filter capacitor, a thirteenth filter capacitor, a fourteenth filter capacitor and a fifteenth filter capacitor;

an input end of the power-supply converting chip is connected to a power supply, one end of the twelfth filter capacitor and one end of the thirteenth filter capacitor;

the other end of the twelfth filter capacitor and the other end of the thirteenth filter capacitor are firstly connected and then grounded;

an output end of the power-supply converting chip is connected to the power supplying end of the input power supply of the second optical coupler;

the output end of the power-supply converting chip is also connected to one end of the fourteenth filter capacitor and one end of the fifteenth filter capacitor; and the other end of the fourteenth filter capacitor and the other end of the fifteenth filter capacitor are firstly connected and then grounded.

* * * * *